United States Patent
Kim

(10) Patent No.: US 9,247,626 B2
(45) Date of Patent: Jan. 26, 2016

(54) LIGHT EMITTING MODULE TESTING APPARATUS

(71) Applicant: SAMSUNG ELECTRONICS CO., LTD., Suwon-si, Gyeonggi-do (KR)

(72) Inventor: Sun Ki Kim, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/334,337

(22) Filed: Jul. 17, 2014

(65) Prior Publication Data

US 2015/0102728 A1    Apr. 16, 2015

(30) Foreign Application Priority Data

Oct. 16, 2013 (KR) .................. 10-2013-0123371

(51) Int. Cl.
| | |
|---|---|
| *H05B 37/03* | (2006.01) |
| *G01J 1/08* | (2006.01) |
| *G01J 1/42* | (2006.01) |
| *H05B 33/08* | (2006.01) |

(52) U.S. Cl.
CPC . *H05B 37/03* (2013.01); *G01J 1/08* (2013.01); *H05B 33/08* (2013.01); *G01J 2001/4247* (2013.01)

(58) Field of Classification Search
CPC .............. H05B 41/325; H05B 41/3922; H05B 37/0272; H05B 37/0218; H05B 37/03; H05B 37/0227; G03B 15/05; Y02B 20/46
USPC .......................................... 315/151, 149, 152
See application file for complete search history.

(56) References Cited

U.S. PATENT DOCUMENTS

| | | |
|---|---|---|
| 6,372,608 B1 | 4/2002 | Shimoda et al. |
| 6,445,139 B1 | 9/2002 | Marshall et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |

(Continued)

FOREIGN PATENT DOCUMENTS

| | | |
|---|---|---|
| JP | 2006-250656 A | 9/2006 |
| KR | 2002-0059729 A | 7/2002 |
| KR | 10-2010-0009925 A | 1/2010 |

*Primary Examiner* — Dylan White
(74) *Attorney, Agent, or Firm* — McDermott Will & Emery LLP

(57) ABSTRACT

A light emitting module testing apparatus includes a sensing unit and a controller. The sensing unit includes a photodiode array sensing light emitted from a light emitting module serving as a test object. The controller generates luminance information based on light sensed by the sensing unit, and sets an operating condition of the light emitting module serving as the test object by comparing the generated luminance information with a pre-set reference range. The light emitting module testing apparatus thereby senses luminance of light emitted from the light emitting module serving as a test object, and sets the operating condition of the light emitting module to have an appropriate luminance.

20 Claims, 17 Drawing Sheets

(56) References Cited

U.S. PATENT DOCUMENTS

| | | |
|---|---|---|
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,812,624 B1 | 10/2010 | Wei et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 2004/0105264 A1* | 6/2004 | Spero ............................ 362/276 |
| 2010/0302515 A1* | 12/2010 | Plut ................................ 353/85 |
| 2011/0204793 A1* | 8/2011 | Gardner, Jr. .................. 315/150 |
| 2012/0050307 A1* | 3/2012 | Mahowald et al. ........... 345/590 |
| 2012/0206050 A1* | 8/2012 | Spero ............................ 315/152 |
| 2013/0026945 A1* | 1/2013 | Ganick et al. ................ 315/246 |
| 2013/0162692 A1 | 6/2013 | Wang |
| 2013/0221852 A1* | 8/2013 | Bowers et al. ................ 315/131 |
| 2014/0183269 A1* | 7/2014 | Glaser ............................ 235/492 |
| 2015/0022093 A1* | 1/2015 | Smith ................ H05B 33/0854 315/151 |
| 2015/0069921 A1* | 3/2015 | Carmel-Veilleux ........... 315/155 |
| 2015/0102728 A1* | 4/2015 | Kim .............................. 315/151 |

\* cited by examiner

LIGHT EMITTING MODULE TESTING APPARATUS

CROSS-REFERENCE TO RELATED APPLICATION

This application claims the benefit of Korean Patent Application No. 10-2013-0123371 filed on Oct. 16, 2013, with the Korean Intellectual Property Office, the disclosure of which is incorporated herein by reference.

BACKGROUND

The present disclosure relates to a light emitting module testing apparatus.

Semiconductor light emitting devices, which emit light based on an electron-hole recombination principle when a current is applied thereto, are widely used as light sources. The semiconductor light emitting devices have various advantages over conventional lighting devices, including low power consumption, high degree of luminance, compactness, and the like. In particular, with the development of nitride light emitting devices, the variety of application in which light emitting modules using semiconductor light emitting devices are used has been greatly expanded to include applications in vehicle headlights, general illumination devices, camera flashes, and the like. Light emitting modules generally need to meet appropriate luminance requirements according to the products in which they are used. As a result, research is being conducted into devices that can be used to determine whether a light emitting module meets appropriate luminance requirements.

SUMMARY

An aspect of the present disclosure may provide a testing apparatus devised to sense light emitted from a light emitting module serving as a test object and to set an operating condition of the light emitting module to have an appropriate luminance.

However, objects of the present disclosure are not limited thereto and objects and effects that may be recognized from technical solutions or embodiments described hereinafter may also be included even if they are not explicitly mentioned.

According to an aspect of the present disclosure, a light emitting module testing apparatus includes a sensing unit and a controller. The sensing unit includes a photodiode array sensing light emitted from a light emitting module serving as a test object. The controller generates luminance information based on light sensed by the sensing unit, and sets an operating condition of the light emitting module serving as the test object by comparing the generated luminance information with a pre-set reference range.

The operating condition of the light emitting module set by the controller may be a current value applied by a driving unit provided in the light emitting module to a light source provided in the light emitting module.

The photodiode array may include first to $n^{th}$ photodiodes, where n is a natural number greater than or equal to 2.

The luminance information generated by the controller may be a luminance profile including information regarding luminance of light sensed at locations of each of the first to $n^{th}$ photodiodes.

The pre-set reference range may include a maximum reference luminance profile serving as an upper limit of the pre-set reference range and a minimum reference luminance profile serving as a lower limit of the pre-set reference range.

When the luminance profile generated by the controller has a region exceeding the maximum reference luminance profile, the controller may set the operating condition of the light emitting module so as to decrease the current value applied by the driving unit provided in the light emitting module to the light source provided in the light emitting module.

When the luminance profile generated by the controller has a region lower than the minimum reference luminance profile, the controller may set the operating condition of the light emitting module so as to increase the current value applied by the driving unit provided in the light emitting module to the light source provided in the light emitting module.

When a difference between a maximum value of the luminance profile generated by the controller and a minimum value of the luminance profile generated by the controller is greater than a difference between the maximum reference luminance profile and the minimum reference luminance profile, the controller may determine that the light emitting module is defective.

At least one of the maximum reference luminance profile and the minimum reference luminance profile may have a linear shape.

At least one of the maximum reference luminance profile and the minimum reference luminance profile may have a curved shape.

The sensing unit may include first to $m^{th}$ photodiode arrays each including first to $n^{th}$ photodiodes, where m and n are natural numbers greater than or equal to 2, and the luminance information generated by the controller may be a single average luminance profile derived by averaging first to $m^{th}$ luminance profiles respectively obtained by the first to $m^{th}$ photodiode arrays.

The sensing unit may be disposed to be positioned directly above a main light emitting surface of the light emitting module.

The photodiode array may include first to $n^{th}$ photodiodes, where n is a natural number greater than or equal to 2, and the sensing unit may include a bar-like light receiving part in which the photodiode array is disposed.

The sensing unit may include first to $m^{th}$ photodiode arrays each including first to $n^{th}$ photodiodes and first to $m^{th}$ bar-like light receiving parts in which the first to $m^{th}$ photodiode arrays are respectively disposed, where n and m are natural numbers greater than or equal to 2.

According to another aspect of the present disclosure, a light emitting module testing apparatus may include a sensing unit and a controller. The sensing unit includes a photodiode array sensing light emitted from a light emitting module, serving as a test object, has a light source, and has a driving unit providing a pre-selected current to drive the light source. The controller generates luminance information based on light sensed by the sensing unit, and compares the luminance information with a pre-set reference range to set the pre-selected current value applied by the driving unit provided in the light emitting module to the light source such that the luminance information of light emitted from the light emitting module serving as the test object satisfies the pre-set reference range.

According to another aspect of the present disclosure, a light emitting module testing apparatus may include a sensing unit and a controller. The sensing unit may include a plurality of photodiodes disposed on a substrate for sensing, at locations of each of the plurality of photodiodes, light emitted from a light emitting module serving as a test object. The controller may be coupled to the sensing unit, may generate a luminance profile including, for each respective location of a plurality of locations of the photodiodes, luminance information of light sensed at the respective location, and may generate a control signal based on comparing the luminance information of light sensed at each respective location with a pre-set luminance range for the respective location.

Each photodiode of the plurality of photodiodes may be connected to a respective transistor, and the controller may receive an electrical signal from each respective transistor connected to a photodiode of the plurality of photodiodes indicative of luminance of light sensed at the location of the respective photodiode.

The controller may generate the luminance profile by averaging, for each of a plurality of locations of photodiodes, luminance information of light sensed by photodiodes at or proximate to the respective location, and may generate the control signal based on comparing the averaged luminance information of light sensed at each location with a pre-set luminance range for the respective location.

The pre-set luminance range may include different luminance ranges for different ones of the locations of the photodiodes.

The sensing unit may be disposed to be positioned directly above a main light emitting surface of the light emitting module.

According to another aspect of the present disclosure, a method of manufacturing a lighting device may include preparing a light source, preparing a light emitting module as a test target with prepared light source, testing the light emitting module, and preparing a lighting device with the light emitting module having undergone testing.

The testing of the light emitting module may include driving the light emitting module, sensing light emitted from the light emitting module, generating luminance information of the sensed light, comparing the luminance information with a pre-set reference range, and setting an operating condition of the light emitting module as a test target according to the comparison result.

The foregoing technical solutions do not fully enumerate all of the features of the present disclosure. The foregoing and other objects, features, aspects and advantages of the present disclosure will become more apparent from the following detailed description of the present disclosure when taken in conjunction with the accompanying drawings.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
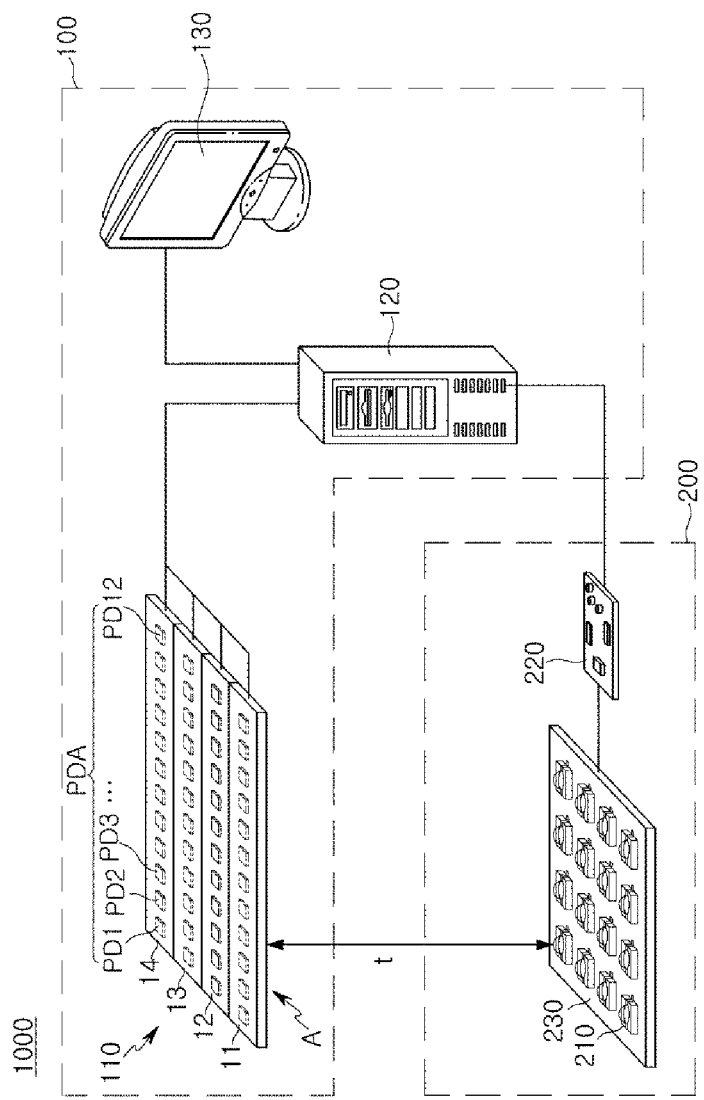
FIG. 1 schematically illustrates a light emitting module testing system according to an exemplary embodiment of the present disclosure.

Hereinafter, exemplary embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 schematically illustrates a light emitting module testing system 1000 according to an exemplary embodiment of the present disclosure.

Referring to FIG. 1, the light emitting module testing apparatus according to the present exemplary embodiment may test a light emitting module 200, serving as a test object, and set an operating condition of the light emitting module 200 as a test target.

In the present exemplary embodiment, the light emitting module 200, serving as a test object, may have a light source 210 disposed on a substrate 230. A plurality of light sources 210 may be provided in the light emitting module 200, and each of the plurality of light sources 210 may include a semiconductor device (for example, a light emitting diode (LED)) emitting light when a current is applied thereto, but the present disclosure is not limited thereto. The light emitting module 200 may include a driving unit 220 electrically connected to the plurality of light sources 210 to provide a current for driving the light sources 210. Here, luminance of the light emitting module 200 may vary according to a magnitude of a current value applied to the light sources 210 from the driving unit 220.

The light emitting module 200 may need to satisfy appropriate luminance conditions according to a product to which the light emitting module 200 is to be applied. For example, a light emitting module used in a vehicle headlight may need to satisfy luminance conditions at a predetermined distance stipulated in regulations. To this end, the light emitting module 200 may be manufactured by setting the number of light sources 210 to be provided in the light emitting module 200 and an appropriate current value to be applied by the driving unit 220 to the plurality of light sources 210 to drive the light sources 210 in advance, in consideration of the luminance of light emitted by each of the light sources 210. However, the light emitting module 220 may exhibit an inappropriate luminance due to a processing error, or the like, occurring while manufacturing one or more of the light source(s) 210 and the driving unit 220. Thus, an exemplary embodiment of the present disclosure provides the light emitting module testing apparatus 100 capable of measuring the luminance of the light emitting module 200 and providing feedback on measurement results to allow for correction of the luminance of the light emitting module 200.

In the present exemplary disclosure, the light emitting module testing apparatus 100 may include a sensing unit 110 measuring luminance of the light emitting module 200 and a controller 120 correcting the luminance of the light emitting module 200 according to luminance measurement results.

The sensing unit 110 may be disposed to be positioned directly aligned with and above a main light emitting surface of the light emitting module 200. The sensing unit 110 may be disposed directly above and spaced apart from the light emitting module 200 at a distance t ranging from 50 cm to 100 cm, but the present disclosure is not limited thereto.

The sensing unit 110 may include photodiode arrays (PDA) sensing light emitted by the light emitting module 200 as a test object. The sensing unit 110 may include at least one light receiving part 11, 12, 13, and 14 having a bar-like shape, and the photodiode arrays PDA may be disposed in each of the light receiving parts 11, 12, 13, and 14. In the light receiving parts 11, 12, 13, and 14, the photodiode arrays PDA may be disposed on a surface A facing the light emitting module 200 (e.g., facing a surface of the light emitting module 200 on which light sources 210 are disposed).

The photodiode arrays PDA may be provided as first to $m^{th}$ photodiode arrays PDA (m is a natural number greater than or equal to 2), and the first to $m^{th}$ photodiode arrays PDA may be disposed in a corresponding first to $m^{th}$ bar-like light receiving parts (e.g., light receiving parts 11, 12, 13, and 14). In this case, a number and/or disposition of the light receiving parts provided in the sensing unit 110 may be appropriately changed according to a size and/or shape of the light emitting module 200 serving as the test object, so that testing and correction operations may be more effectively performed on the light emitting module 200. In the present exemplary embodiment, the photodiode arrays PDA are provided as first to fourth photodiode arrays and disposed in first to fourth light receiving parts 11, 12, 13, and 14, respectively, but the number of light receiving parts may be appropriately changed as necessary.

Figure 2A:
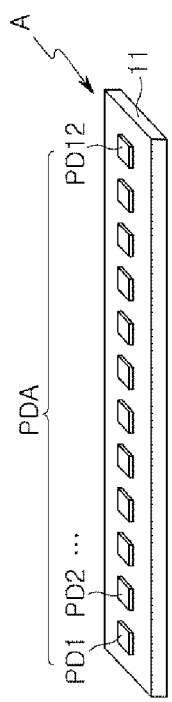
FIGS. 2A and 2B schematically illustrate a light receiving part and a circuit diagram illustrating a portion of a circuit constituting a photo diode array, respectively, according to the exemplary embodiment of the present disclosure.
Figure 2B:
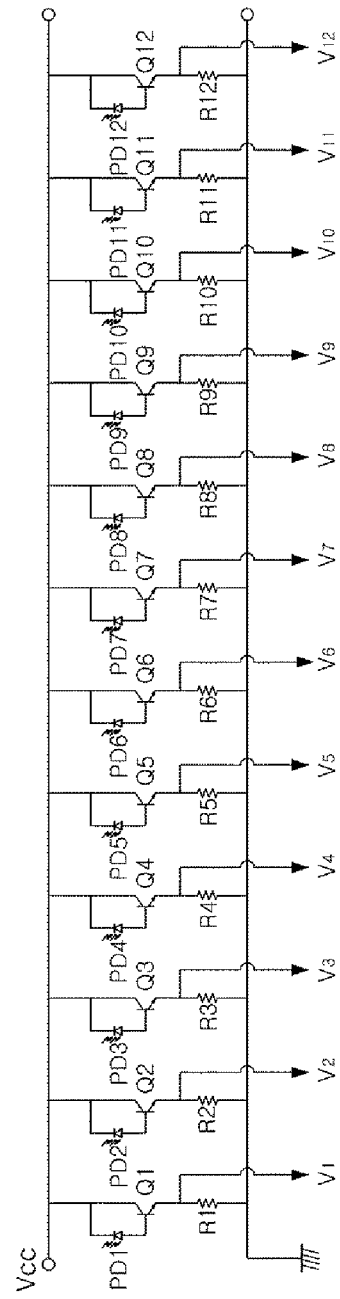

FIGS. 2A and 2B schematically illustrate the light receiving part 11 and a circuit diagram illustrating a portion of a circuit constituting the photo diode array, respectively, according to the present exemplary embodiment.

Referring to FIG. 2A, the photodiode array PDA disposed in the light receiving part 11 includes first to $n^{th}$ photodiodes PD1 to PD12 (n is a natural number greater than or equal to 2). The photodiodes PD1 to PD12 are sensors that operate according to a photovoltaic effect, and are semiconductor devices that convert optical energy into electrical energy. Namely, when light is sensed, the photodiodes PD1 to PD12 are turned on to allow a current to flow, and a magnitude of an output voltage proportionally increases according to the intensity of sensed light. In the present exemplary embodiment, the photodiode array PDA is illustrated as including the first to twelfth photo diodes PD1 to PD12 arranged in a row. However, the arrangement pattern and number of photodiodes provided in the photodiode array PDA may be appropriately changed as necessary.

FIG. 2B is a circuit diagram illustrating a portion of the circuit constituting the photodiode array PDA. However, the circuit diagram is merely illustrative to allow easy understanding of the present exemplary embodiment, and the present disclosure is not limited thereto.

Referring to FIG. 2B, an anode and a cathode of each of the first to twelfth photodiodes PD1 to PD12 are respectively connected to a base and a collector of a corresponding transistor among first to twelfth transistors Q1 to Q12. An emitter of each of the first to twelfth transistors Q1 to Q12 is connected to one terminal of a corresponding sensing resistor R1 to R12, and another terminal of each of the sensing resistors R1 to R12 is connected to ground. Magnitudes V1 to V12 of voltages applied to respectively ones of the sensing resistors R1 to R12 by the photodiodes PD1-PD12 and transistors Q1-Q12 may vary according to an intensity of light sensed at positions of the first to twelfth photodiodes PD1 to PD12. Thus, the light receiving part 11 may deliver an electrical signal V1-V12 corresponding to the intensity of light sensed in the positions of each of the first to twelfth photodiodes PD1 to PD12 to the controller 120. According to the present exemplary embodiment, luminance of light sensed in the positions of each of the photodiodes PD1 to PD12 may be precisely converted into an electrical signal and delivered to the controller 120 by using the photodiodes PD1 to PD12.

The controller 120 may generate luminance information corresponding to light sensed by the sensing unit 110, and compare the luminance information with a pre-set reference range to set an operating condition of the light emitting module 200 as a test target. For example, in the present exemplary embodiment, the controller 120 may generate luminance information corresponding to light sensed by the first to fourth light receiving parts 11, 12, 13, and 14 provided in the sensing unit 110 from electrical signals regarding light sensed by the first to fourth light receiving parts 11, 12, 13, and 14. Here, the luminance information may be a luminance profile including information regarding luminance of light sensed in the region in which the first to $n^{th}$ photo diodes are disposed in each light receiving part. This will be described in more detail with reference to FIGS. 1, 3A, and 3B.

Figure 3A:
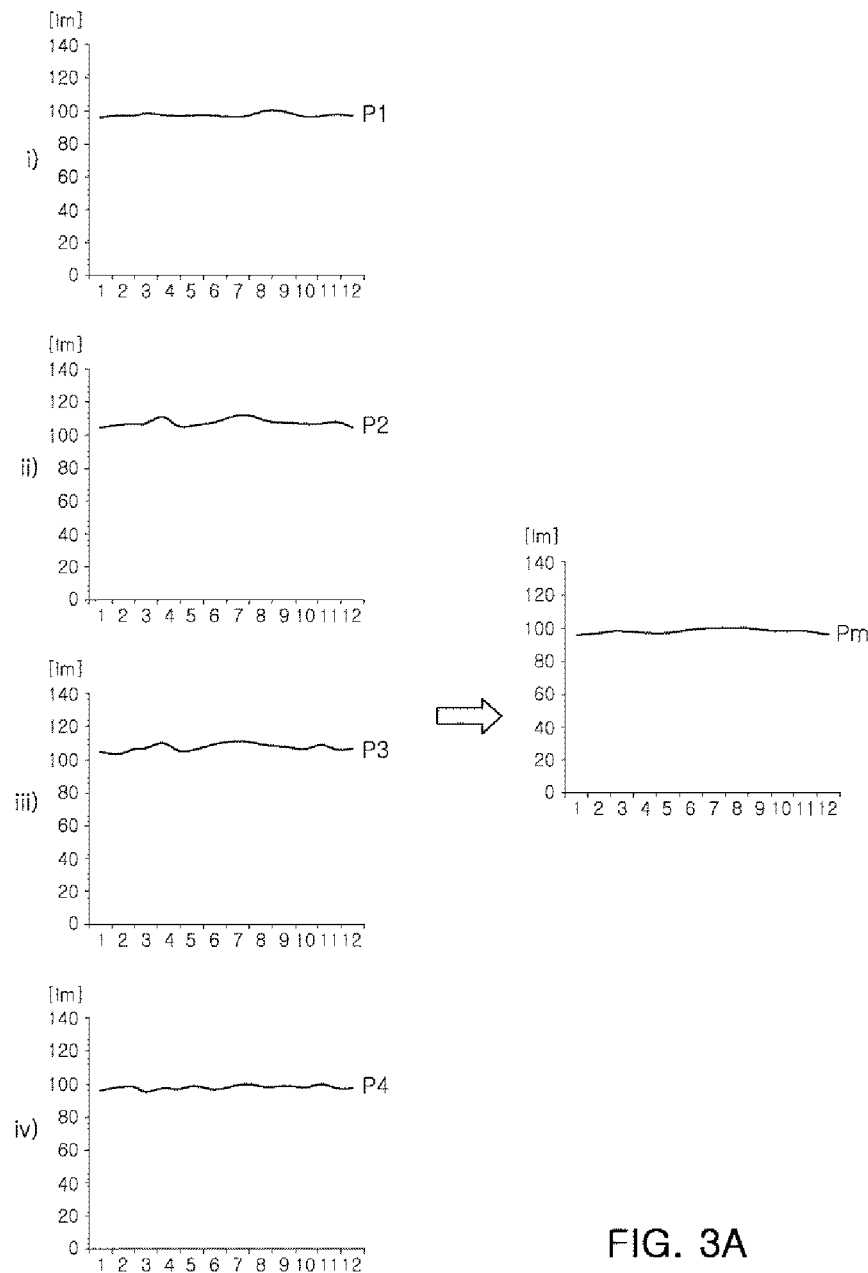
FIGS. 3A and 3B are luminance profiles showing luminance information and reference ranges according to the exemplary embodiment of the present disclosure.

FIG. 3A illustrates first to fourth luminance profiles P1, P2, P3, and P4 including information regarding luminance of light sensed by each of the first to fourth light receiving parts 11, 12, 13, and 14, and an average luminance profile Pm derived by averaging the first to fourth luminance profiles P1, P2, P3, and P4.

First, profiles i) to iv) shown on the left side of FIG. 3A illustrate the first to fourth luminance profiles P1, P2, P3, and P4 corresponding to the luminance information of light sensed by the first to fourth light receiving parts 11, 12, 13, and 14, respectively. Here, each of the first to fourth luminance profiles P1, P2, P3, and P4 may be understood as a line formed by connecting luminance value measurements corresponding to light sensed by the first to twelfth photodiodes PD1 to PD12 disposed in a corresponding one of the first to fourth light receiving parts 11, 12, 13, and 14.

Meanwhile, as illustrated, the second and third profiles P2 and P3 have luminance information of light sensed by the second and third light receiving parts 12 and 13 facing an interior region of the main light emitting surface of the light emitting module 200. As such, the second and third profiles P2 and P3 may have luminance measurement values that are higher than those of the first and fourth luminance profiles P1 and P4, since luminance information sensed by the first and fourth light receiving parts 11 and 14 facing an outer side or outer perimeter of the main light emitting surface of the light emitting module 200. However, such results may vary according to the shape and disposition of the light emitting module 200.

Also, as illustrated, the luminance profiles P1-P4 and Pm are plotted with values along the vertical axis in lumen [lm], a measurement unit of the velocity of light. However, the present disclosure is not limited thereto and, for example, the luminance profiles can be plotted according to units of volt [V] or ampere [A] of electrical signals converted by the first to $n^{th}$ photodiodes provided in the respective light receiving parts.

The profile illustrated on the right side of FIG. 3A is a single average luminance profile Pm derived by averaging the first to fourth luminance profiles P1, P2, P3, and P4. The average luminance profile may include a plurality of average luminance values each corresponding to an average of luminance values sensed by photodiodes located at and proximate to a respective location. In the present exemplary embodiment, the controller 120 may compare the average luminance profile Pm with a pre-set reference range. Here, the pre-set reference range may include a maximum reference luminance profile Ref.H as an upper limit of the reference range and a minimum reference luminance profile Ref.L as a lower limit of the reference range as described hereinafter with reference to FIG. 3B.

Figure 3B:
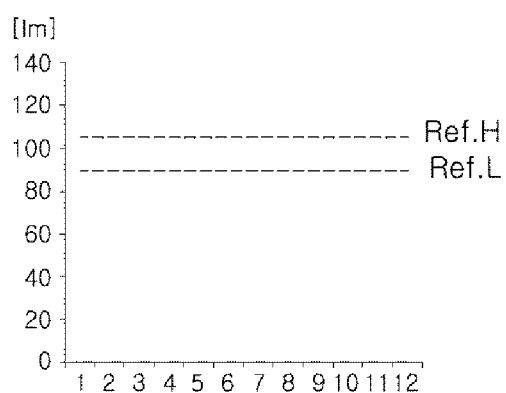

FIG. 3B illustrates the maximum reference luminance profile Ref.H and the minimum reference luminance profile Ref.L. In the present exemplary embodiment, the controller 120 may determine whether the average luminance profile Pm is within a range defined by the maximum reference luminance profile Ref.H and the minimum reference luminance profile Ref.L, and correct the luminance of the light emitting module 200 according to the determined results. In detail, the controller 120 may generate a control signal to set an operating condition of the light emitting module 200 according to the determined results, and here, the operating condition of the light emitting module 200 set by the controller 120 may be a pre-selected current value applied by the driving unit 220 provided in the light emitting module 200 to the light sources 210 provided in the light emitting module 200. Details thereof will be described hereinafter with reference to FIGS. 4A through 6.

FIGS. 4A through 6 are luminance profiles specifically illustrating an operating principle used by the controller 120 to set an operating condition of the light emitting module 200 by comparing luminance information with the pre-set reference range according to the present exemplary embodiment.

Figure 4A:
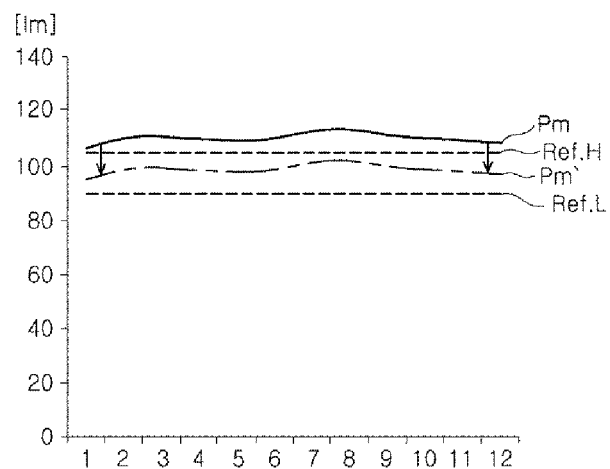
FIGS. 4A, 4B, 5A, 5B, and 6 are luminance profiles specifically illustrating an operating principle used by a controller to set an operating condition of a light emitting module by comparing luminance information with a pre-set reference range according to the exemplary embodiment of the present disclosure.
Figure 4B:
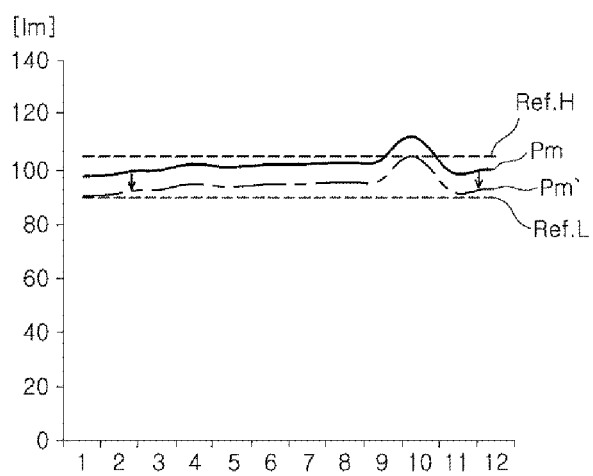

First, as illustrated in FIGS. 4A and 4B, luminance information of light sensed by the sensing unit 110, for example an average luminance profile Pm, may include a region exceeding the maximum reference luminance profile Ref.H serving as an upper limit of the pre-set reference range. In detail, FIG. 4A illustrates a case in which a pre-selected current value applied by the driving unit 220 provided in the light emitting module 200 to the light sources 210 provided in the light emitting module 200 is set to be too high, and FIG. 4B illustrates a case in which a pre-selected current value applied by the driving unit 220 to the light sources 210 is appropriately set but a fault (over-output) occurs in some light sources 210.

In the illustrative cases shown in FIGS. 4A and 4B, the controller 120 may set an operating condition of the light emitting module 200 (for example, a pre-selected current value applied by the driving unit 220 provided in the light emitting module 200 to the light sources 210 provided in the light emitting module 200) such that the pre-selected current value is reduced so the average luminance profile Pm does not to exceed the maximum reference luminance profile Ref.H. Thus, a luminance profile of light emitted by the light emitting module 200 may be corrected to satisfy the pre-set reference range Pm' indicated by the alternated long and short dash lines shown in FIGS. 4A and 4B.

To this end, the controller 120 may be connected to the driving unit 220 provided in the light emitting module 200 as illustrated in FIG. 1. The controller 120 may also provide predetermined direct current (DC) or alternating current (AC) driving power to the driving unit 220 while testing is performed on the light emitting module 200, but the present disclosure is not limited thereto. In this case, the type (DC or AC) of driving power provided by the controller 120 to the driving unit 220 may vary according to a type of power applied (or received) from the outside when the light emitting module 200 is used in a product. For example, when the light emitting module 200 is used in a product that is driven by DC power received from the outside, the controller 120 may provide the predetermined DC power to the driving unit 200 while testing is performed, and when the light emitting module 200 is used in a product that is driven by AC power received from the outside, the controller 120 may provide the predetermined AC power to the driving unit 200 while testing is performed. However, the present disclosure is not limited thereto and the driving unit 220 may receive the predetermined driving power from the outside, rather than from the controller 120, while testing is being performed on the light emitting module 200.

Figure 5A:
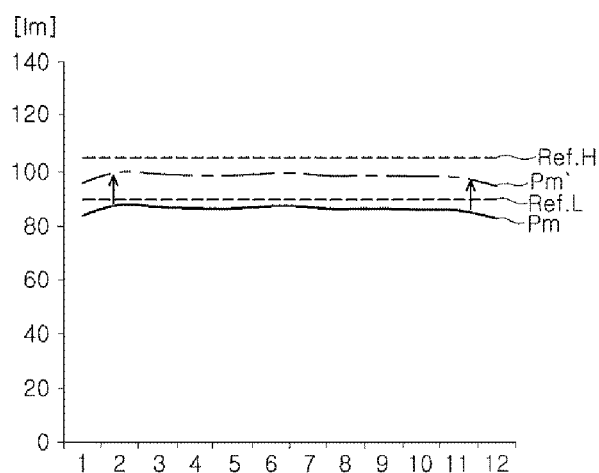
Figure 5B:
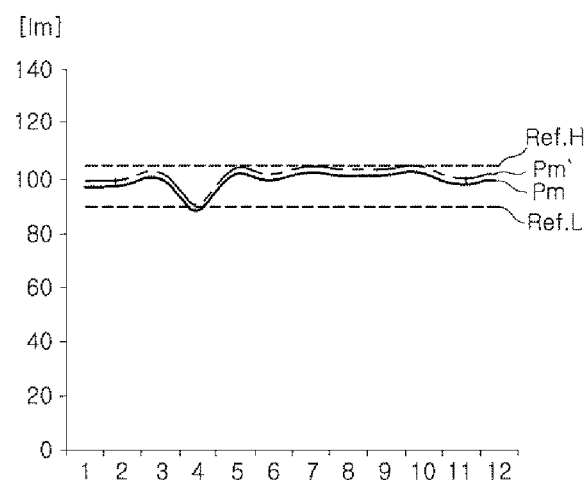

Meanwhile, as illustrated in FIGS. 5A and 5B, the luminance information, for example, the average luminance profile Pm, sensed by the sensing unit 110 may include a region lower than the minimum reference luminance profile Ref.L serving as a lower limit of the pre-set reference range.

In detail, FIG. 5A illustrates a case in which a pre-selected current value applied from the driving unit 220 provided in the light emitting module 200 to the light sources 210 provided in the light emitting module 200 is set to be too low, and FIG. 5B illustrates a case in which a pre-selected current value applied from the driving unit 220 to the light sources 210 is set to be appropriate, but some light sources 210 are defective (i.e., do not operate).

In the illustrative cases shown in FIGS. 5A and 5B, the controller 120 may set an operating condition of the light emitting module 200 (for example, a current value applied by the driving unit 220 provided in the light emitting module 200 to the light sources 210 provided in the light emitting module 200) such that the pre-selected current value is increased so the average luminance profile Pm is not lower than the minimum reference luminance profile Ref.L. Thus, a luminance profile of light emitted by the light emitting module 200 may be corrected to satisfy the pre-set reference range Pm' indicated by the alternating long and short dash lines shown in FIGS. 5A and 5B.

Figure 6:
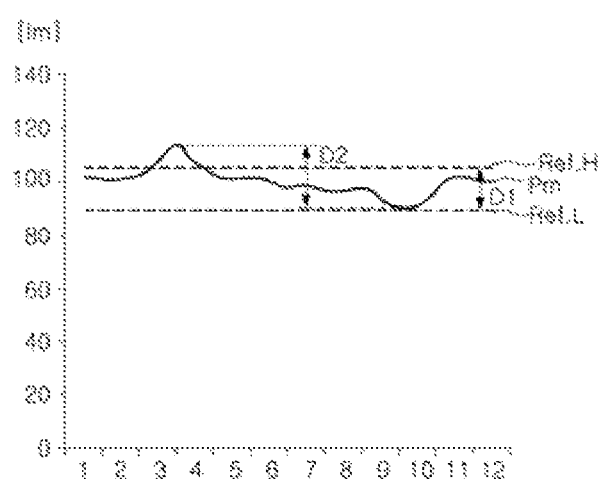

In addition, as illustrated in FIG. 6, the average luminance profile Pm may have a region exceeding the maximum reference luminance profile Ref.H and a region lower than the minimum reference luminance profile Ref.L according to a degree of defect of the light emitting module 200. Here, although the driving unit 220 applies an optimized current value to the light sources 210, the light emitting module 200 may not satisfy the pre-set reference range. In this case, the controller 120 according to the present exemplary embodiment may determine that the light emitting module 200 is defective.

In detail, for example, the controller 120 may calculate a difference D2 between a maximum value and a minimum value of the average luminance profile Pm and compare the calculation result with a difference D1 between the maximum reference luminance profile Ref.H and the minimum reference luminance profile Ref.L. When the calculation result D2 is greater than the difference D1 between the maximum reference luminance profile Ref.H and the minimum reference luminance profile Ref.L (namely, in the case of D2>D1), the controller 120 may determine that the light emitting module 200 is defective.

Figure 7:
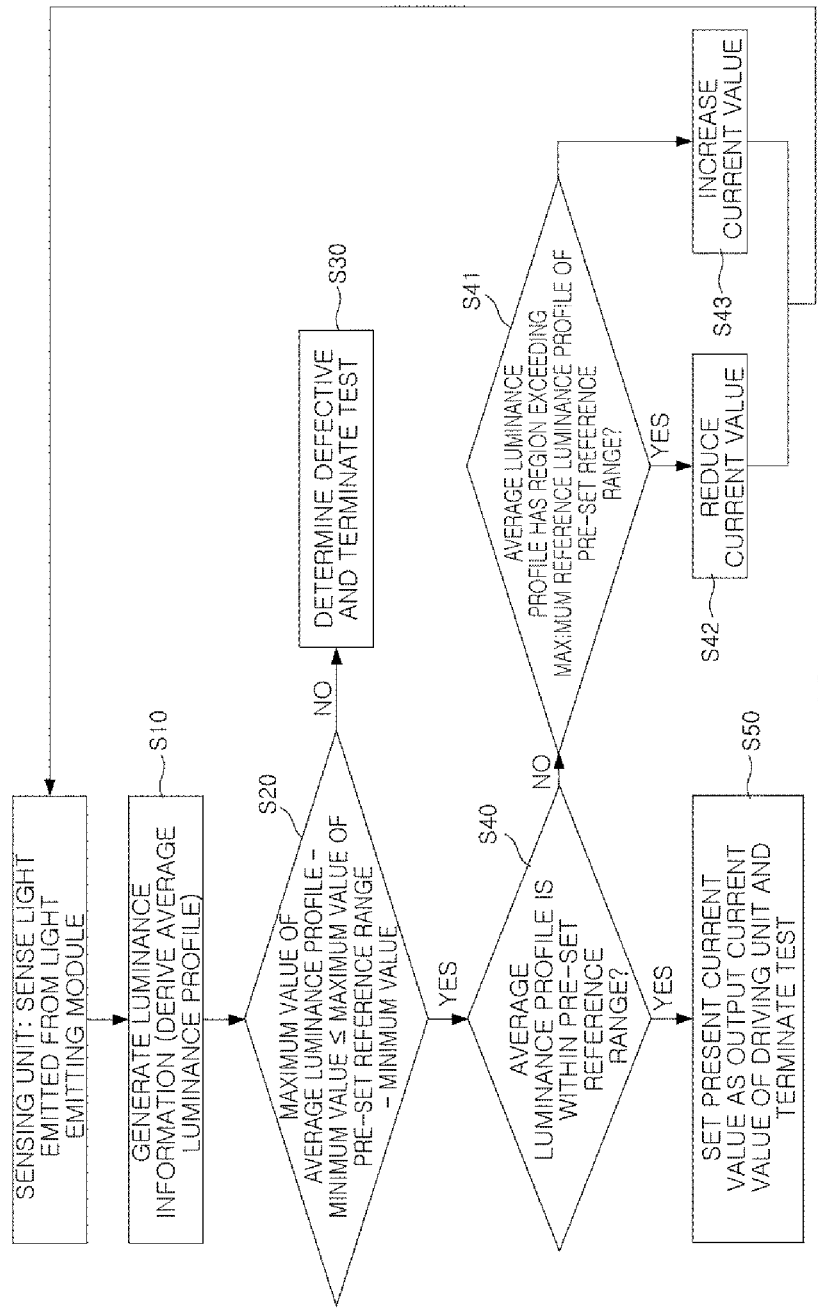
FIG. 7 is a flow chart illustrating an example of a process performed in the controller while the light emitting module is being tested.

FIG. 7 is a flow chart illustrating an example of a process performed in the controller 120 while the light emitting module is being tested.

Referring to FIG. 7, the controller 120 generates the luminance information from light sensed by the sensing unit 110 (S10). As described above, the luminance information may be an average luminance profile Pm derived by averaging luminance profiles including information regarding luminance of light sensed at locations of the first to $n^{th}$ photodiodes disposed in the first to $m^{th}$ light receiving parts provided in the sensing unit 110.

Next, the controller 120 may calculate a difference D2 between a maximum value of the average luminance profile Pm and a minimum value thereof, and compare the calculation result D2 with a difference D1 between a maximum value of a pre-set reference range and a minimum value of the pre-set reference range (S20). Here, the difference between the maximum value of the pre-set reference range and the minimum value thereof may be a difference between a maximum reference luminance profile Ref.H as an upper limit of the reference range and a minimum reference luminance profile Ref.L as a lower limit of the reference range.

When the difference D2 between the maximum value and the minimum value of the average luminance profile Pm is greater than the difference between the maximum value and the minimum value of the pre-set reference range, the controller 120 may determine that the light emitting module 200 is defective (S30) and may terminate testing.

Meanwhile, when the difference D2 between the maximum value and the minimum value of the average luminance profile Pm is smaller than or equal to the difference between the maximum value and the minimum value of the pre-set reference range, the controller 120 determines whether the average luminance profile Pm is within the pre-set reference range (S40). If it is determined that the average luminance profile Pm is within the pre-set reference range, the controller 120 sets a present current value applied by the driving unit 220 of the light emitting module 200 to the light sources 210 as an output current value of the driving unit 220 and terminates the test (S50). On the other hand, if it is determined that the average luminance profile Pm exceeds the pre-set reference range, the controller 120 determines whether the average luminance profile Pm has a region exceeding the maximum reference luminance profile Ref.H serving as an upper limit of the pre-set reference range (S41). If it is determined that the average luminance profile Pm has a region exceeding the maximum reference luminance profile Ref.H, the controller 120 adjusts the current value applied by the driving unit 220 of the light emitting module 200 to the light sources 210 such that it is decreased (S42). Conversely, if it is determined that the average luminance profile Pm does not have a region exceeding the maximum reference luminance profile Ref.H, the controller 120 adjusts the current value applied by the driving unit 220 of the light emitting module 200 to the light sources 210 such that it is increased (S43). Thereafter, the controller 12 repeats the operation of generating the luminance information from light sensed in the light emitting module 200 to set an operating condition (e.g., a current value) of the light emitting module 200 so that the light emitting module 200 may have an appropriate luminance.

Hereinafter, other elements of the light emitting module testing apparatus 100 according to the present exemplary embodiment will be described with reference to FIG. 1.

Referring to FIG. 1, the light emitting module testing apparatus 100 may further include a display unit 130 configured to display at least one type of information among the luminance information (e.g., the average luminance profile Pm) generated by the controller 120, the pre-set reference range (e.g., the maximum reference luminance profile Ref.H and the minimum reference luminance profile Ref.L), the comparison result of the luminance information and the reference range, and information on whether the light emitting module 200 as a test object is defective.

According to the present exemplary embodiment, the light emitting module testing apparatus 100 senses luminance of light emitted from the light emitting module 200 serving as a test object and sets an operating condition of the light emitting module 200 to have appropriate luminance.

Figure 8A:
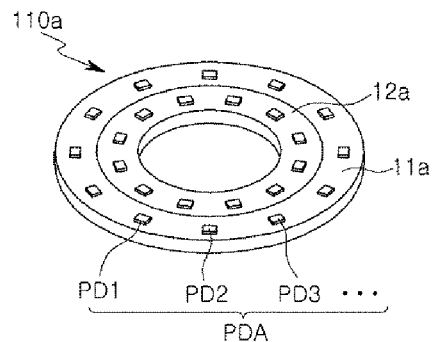
FIGS. 8A through 8C illustratively show sensing units provided in a light emitting module testing apparatus according to another exemplary embodiment of the present disclosure.
Figure 8B:
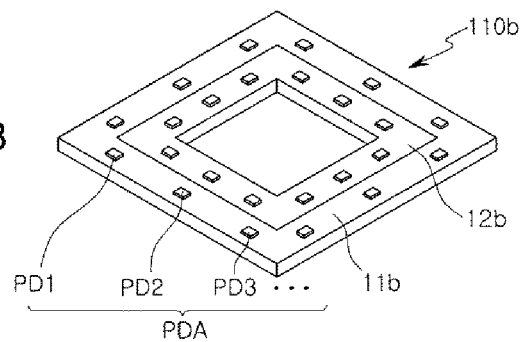
Figure 8C:
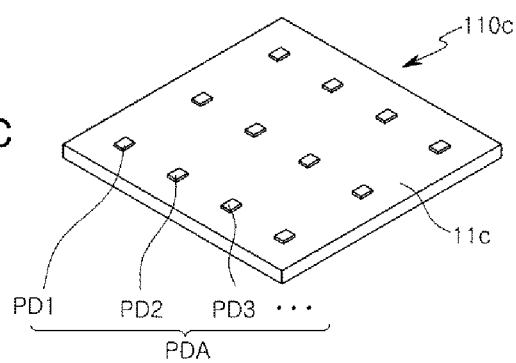

FIGS. 8A through 8C illustratively show sensing units 110a, 110b, and 110c provided in a light emitting module testing apparatus according to another exemplary embodiment of the present disclosure.

As illustrated in FIGS. 8A and 8B, the sensing units 110a and 110b may include at least one light receiving part 11a, 12a, 11b, and 12b in which photodiode arrays PDA are disposed (in the present exemplary embodiment, two light receiving parts are illustrated as being included in each of the sensing units 110a and 110b). The light receiving parts 11a, 12b, 11b, and 12b may include photodiode arrays PDA that each include first to $n^{th}$ photodiodes PD1, PD2, PD3, and the like. Here, unlike in the exemplary embodiment of FIGS. 1 and 2, the light receiving parts 11a, 12b, 11b, and 12b may have a closed-loop shape. For example, the light receiving parts 11a and 12a illustrated in FIG. 8A may have a circular closed-loop shape (e.g., a donut shape), and the light receiving parts 11b and 12b illustrated in FIG. 8B may have a quadrangular closed-loop shape. In this case, the other light receiving parts 12a and 12b may each have a closed-loop shape that fits into and can be disposed within the corresponding closed-loop shape 11a and 11b described above. Also, as illustrated in FIG. 8C, a light receiving part 11c may have a square shape. Shapes and dispositions of the light receiving parts and photodiodes may be appropriately modified according to conditions such as shapes and dispositions of the light emitting module serving as a test object.

Figure 9:
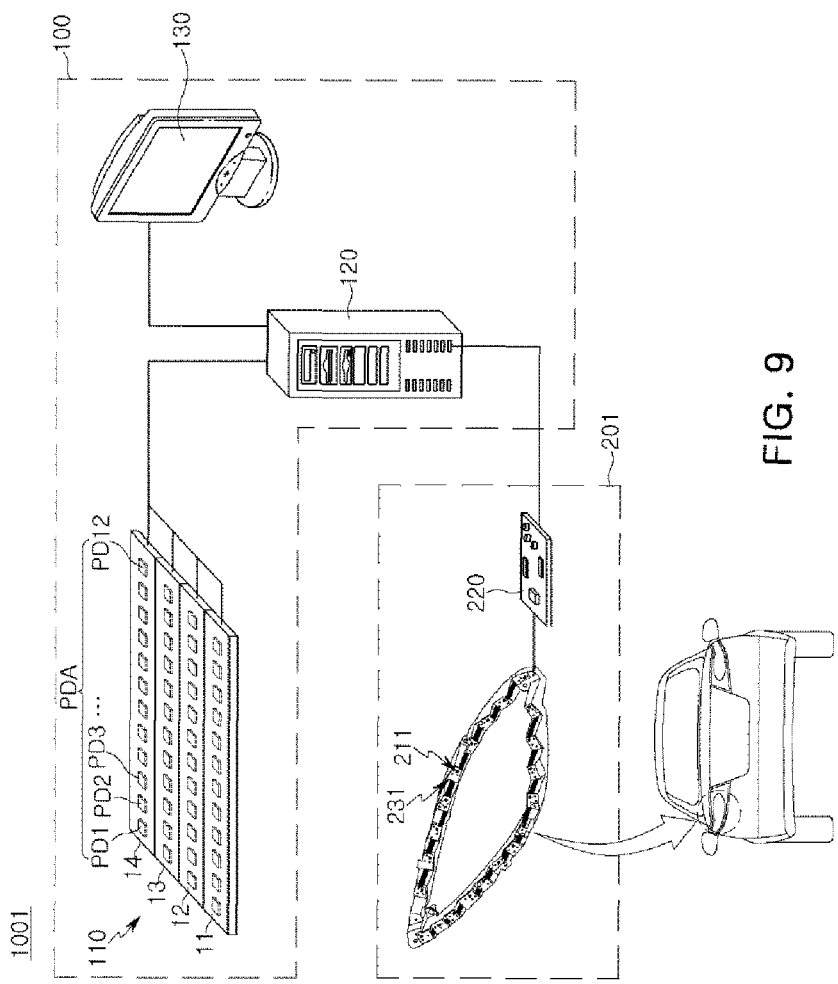
FIG. 9 illustratively shows a light emitting module testing system according to an exemplary embodiment of the present disclosure.

FIG. 9 illustratively shows a light emitting module testing system 1001 according to another exemplary embodiment of the present disclosure. The light emitting module testing system 1001 according to the present exemplary embodiment may be understood as being identical to that of the former exemplary embodiment as described above, except for the shape of a light emitting module serving as a test object and the shapes of maximum and minimum reference luminance profiles.

In detail, as illustrated in FIG. 9, the light emitting module 201 serving as a test object in the present exemplary embodiment may be a light emitting module configured for use in a vehicle headlight. The light emitting module 201 may include a plurality of light sources 211 disposed on a substrate 231 and a driving unit 220 for driving the light sources 211. A main light emitting surface of the light emitting module 201 may have a closed-loop shape (e.g., a donut shape). In this case, since no light source 211 is present in an inner or central portion of the closed-loop shape, luminance measured in the internal or central region of the sensing unit 110 may be low. Thus, a pre-set reference range input to the controller 120 may be set in consideration of the shape of the light emitting module 201.

Figure 10:
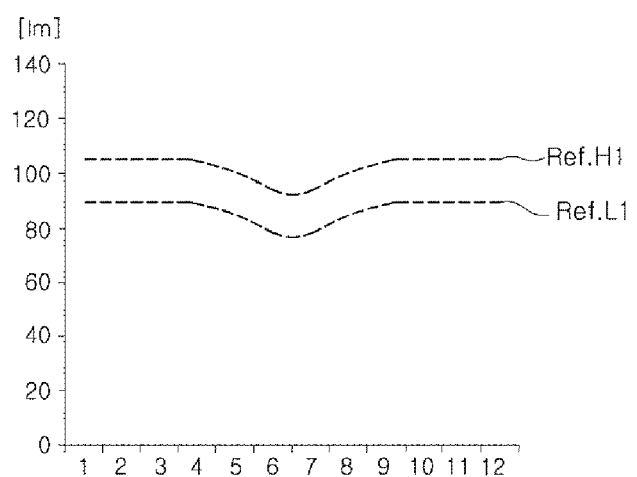
FIG. 10 is a luminance profile illustrating a reference range set in a controller of the light emitting module testing apparatus according to an exemplary embodiment of the present disclosure.

In detail, in the exemplary embodiment of FIG. 3B, the maximum reference luminance profile Ref.H and the minimum reference luminance profile Ref.L are illustrated as having a linear shape, but the shapes of the maximum reference luminance profile Ref.H and the minimum reference luminance profile Ref.L may be appropriately modified according to the shape and disposition pattern of the light sources 211 on the light emitting module 201. As such, in the exemplary embodiment of FIG. 9, maximum and minimum reference luminance profiles Ref.H1 and Ref.L1 may be modified to have curved shapes as illustrated in FIG. 10. In the present exemplary embodiment, the curved shapes are illustrated as being downwardly concave, but they may more generally be modified in other ways according to the shapes and disposition patterns of light sources on a light emitting module serving as a test object.

Figure 11:
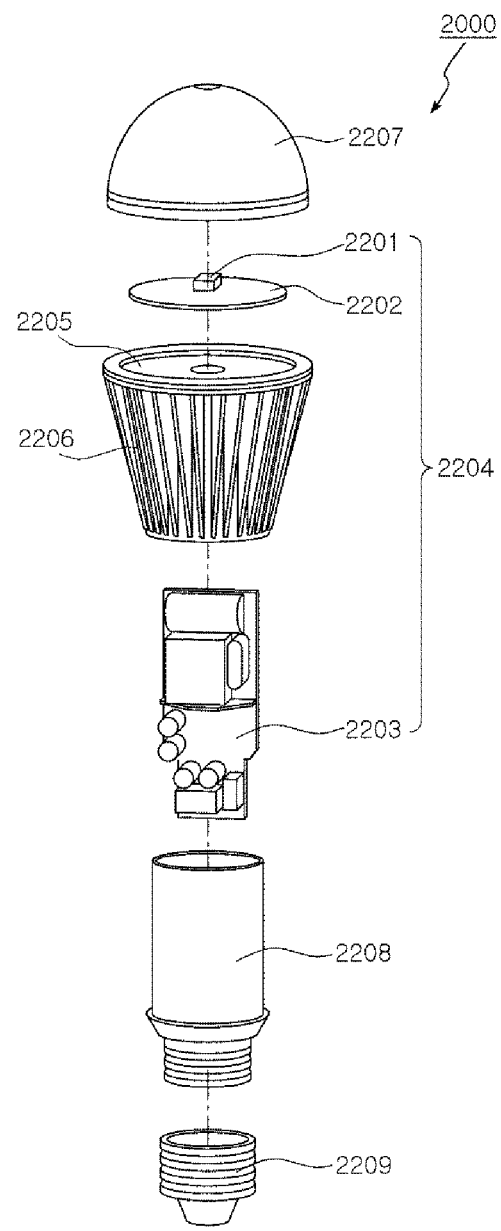
FIGS. 11 and 12 illustratively show a lighting device employing a light emitting module according to an exemplary embodiment of the present disclosure.
Figure 12:
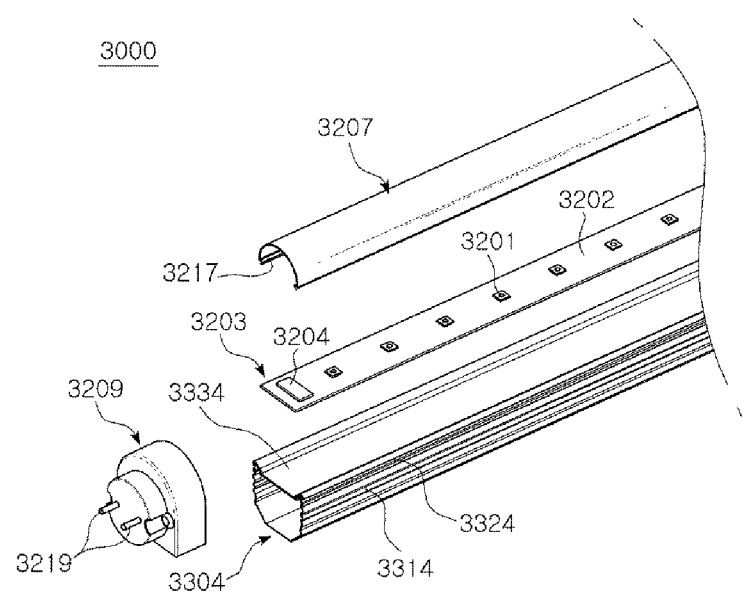

FIGS. 11 and 12 illustratively show a lighting device employing a light emitting module according to an exemplary embodiment of the present disclosure.

In detail, the light emitting module test system according to the present exemplary embodiment is not limited to use with vehicle headlight, and may more generally be used with a bulb-type and/or L-tube type lighting device as illustrated in FIGS. 11 and 12.

For example, a lighting device 2000 may be a bulb-type lamp as illustrated in FIG. 11. The lighting device 2000 may have a shape similar to that of an incandescent lamp in order to replace a conventional incandescent lamp and may output light having optical characteristics (e.g., color, color temperature, and the like) similar to those of an incandescent lamp.

Referring to the exploded perspective view of FIG. 11, the lighting device 2000 includes a light emitting module 2204 and an external connection unit 2209. Also, the lighting device 2000 may further include external structures such as external and internal housings 2206 and 2208 and a cover unit 2207. The light emitting module 2204 may include a light source 2201, a substrate 2202 on which the light source is mounted, and a driving unit 2203 for driving the light source 2201.

In the lighting device 2000, the light emitting module 2204 may include the external housing 2206 acting as a heat dissipation unit, and the external housing 2206 may include a heat dissipation plate 2205 directly in contact with the light emitting module 2204 in order to have an enhanced heat dissipation effect. The lighting device 2000 may include the cover unit 2207 mounted on the light emitting module 2204 and having a convex lens shape. The driving unit 2203 may be installed in the internal housing 2208 and receive power provided from the external connection unit 2209 having a socket structure.

Referring to the exploded perspective view of FIG. 12, a lighting device 3000 according to the present exemplary embodiment may include a light emitting module 3203, a body unit 3304, and a terminal unit 3209, and may further include a cover unit 3207.

The light emitting module 3203 may include a substrate 3202, a plurality of light sources 3201 mounted on the substrate 3202, and a driving unit 3204 for driving the plurality of light sources 3201.

The body unit 3304 may allow the light emitting module 3203 to be fixedly installed on one surface thereof. The body unit 3304, a type of support structure, may include a heat sink. The body unit 3304 may be made of a material having excellent heat conductivity to outwardly dissipate heat generated by the light emitting module 3203. For example, the body unit 3304 may be formed of a metal, but the present disclosure is not limited thereto.

The body unit 3304 may have a generally elongated bar-like shape corresponding to the shape of the substrate 3202 of the light emitting module 3203. The body unit 3304 may have a recess 3334 formed on one surface thereof to accommodate the light emitting module 3203 therein.

A plurality of heat dissipation fins 3314 may be protruded from both outer surfaces of the body unit 3304 to dissipate heat.

Stoppage grooves 3324 may be formed in both edges of the outer surface positioned above the recess 3334 and extend in a length direction of the body unit 3304. The cover unit 3207 described below may be fastened to the stoppage grooves 3324.

Both end portions of the body unit 3304 in the length direction thereof may be open, and the body unit 3304 may have a pipe structure with both end portions thereof open. In the present exemplary embodiment, the body unit 3304 is illustrated as having a structure in which both end portions thereof are open, but the present disclosure is not limited thereto. For example, only one of both end portions of the body unit 3304 may be open.

The terminal unit 3209 may be provided in at least open side among both end portions of the body unit 3304 in the length direction to supply power to the light emitting module 3203. In the present exemplary embodiment, both end portions of the body unit 3304 are open, so the terminal unit 3209 is illustrated to be disposed in both end portions of the body unit 3304. However, the present disclosure is not limited thereto, and when the body unit 3304 has a structure in which only one side thereof is open, the terminal unit 3209 may be provided in the single open end portion among both end portions of the body unit 3304.

The terminal unit 3209 may be fastened to both open end portions of the body unit 3304 in order to cover the open end portions. The terminal unit 3209 may include electrode pins 3219 protruding outwards.

The cover unit 3207 is fastened to the body unit 3304 to cover the light emitting module 3203. The cover unit 3207 may be formed of a material allowing light to be transmitted therethrough.

The cover unit 3207 may have a semicircular curved surface allowing light to be generally irradiated outwards in a uniform manner. Protrusions 3217 may be formed on a bottom surface of the cover unit 3207 fastened to the body unit 3304, in a length direction of the cover unit 3207, and engaged with the stoppage grooves 3324 of the body unit 3304.

In the present exemplary embodiment, the cover unit 3207 is illustrated as having a semicircular shape, but the present disclosure is not limited thereto. For example, the cover unit 3207 may have a flat quadrangular shape or may have any other polygonal shape. The shape of the cover unit 3207 may be variously modified according to an illumination design in which light is irradiated.

Hereinafter, a method for manufacturing a lighting device according to an exemplary embodiment of the present disclosure will be described.

Figure 13:
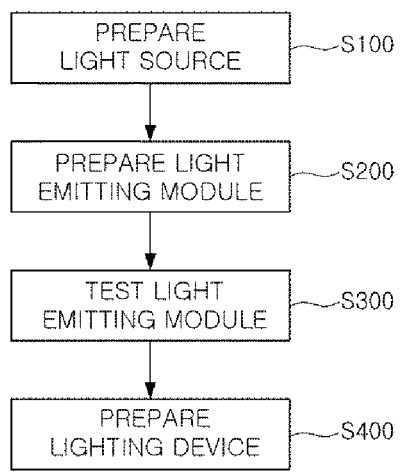
FIG. 13 is a flow chart illustrating a method for manufacturing a lighting device according to an exemplary embodiment of the present disclosure.

FIG. 13 is a flow chart illustrating a method for manufacturing a lighting device according to an exemplary embodiment of the present disclosure.

Referring to FIG. 13, the method for manufacturing a lighting device according to the present exemplary embodiment may include operation S100 to prepare a light source, operation S200 to prepare a light emitting module as a test object of the light source, operation S300 to test the light emitting module, and operation S400 to prepare a lighting device with the test-finished light emitting module. Hereinafter, the manufacturing method according to the present exemplary embodiment will be described in detail with reference to FIGS. 14 through 17.

Figure 14:
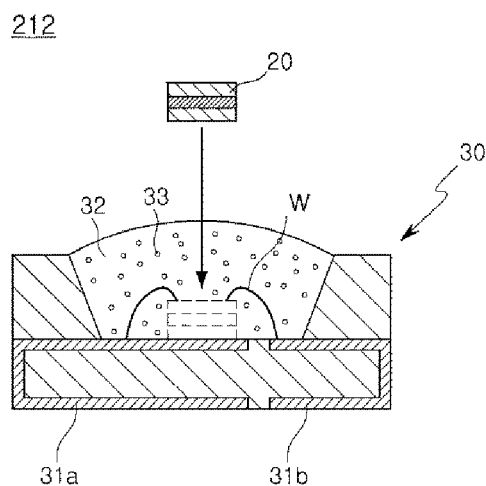
FIG. 14 is a cross-sectional view illustrating a light source that may be used as part of the method for manufacturing a lighting device according to an exemplary embodiment of the present disclosure.

FIG. 14 is a cross-sectional view illustrating a light source 212 that may be used in the method for manufacturing a lighting device according to the present exemplary embodiment, such as a lighting device having undergone operation S100 to prepare a light source.

In the present exemplary embodiment, the light source 212 may include a semiconductor device (e.g., an LED 20) emitting light when a current is applied thereto. In this case, the LED 20 may include an n-type semiconductor layer, a p-type semiconductor layer, and an active layer disposed therebetween. The active layer may be formed as a nitride semiconductor having a single or multi-quantum well structure and including $In_xAl_yGa_{1-x-y}N(0 \leq x \leq 1, 0 \leq y \leq 1, x+y \leq 1)$, and may emit blue light.

In the present exemplary embodiment, the light source 212 may include a package body 30 in which the LED 20 is disposed. The package body 30 may include a cavity accommodating the LED 20 and a pair of lead frames 31*a* and 31*b*. The package body 30 may be formed of an opaque resin or a resin having a high degree of reflectivity. The package body 30 may be provided by using a polymer resin that may easily undergo an injection molding process. However, the present disclosure is not limited thereto and the package body 30 may be formed of various non-conductive materials.

The pair of lead frames 31*a* and 31*b* may be electrically connected to the LED 20 by using conductive wires W or being brought into contact with the LED 20, and may be used as a terminal for applying an external electrical signal. To this end, the lead frames 31*a* and 31*b* may be formed of a metal having excellent electrical conductivity.

An encapsulator 32 filling the cavity may be formed of a light-transmissive resin such as silicon or epoxy. The encapsulator 32 may include a wavelength conversion material excited by an excitation light source (e.g., LED 20) to emit light having a wavelength different from that of the excitation light source. The wavelength conversion material 33 may include at least one of a phosphor and a quantum dot.

Figure 15:
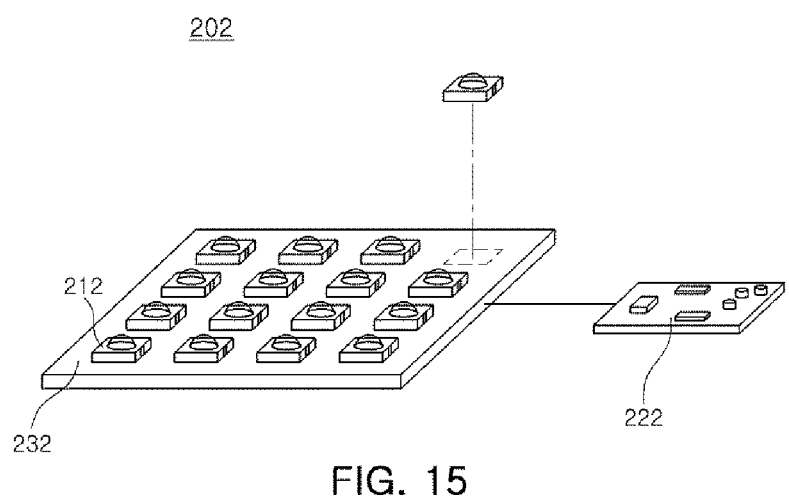
FIG. 15 is a perspective view specifically illustrating an operation to prepare a light emitting module as a test object with the light source.

FIG. 15 is a perspective view specifically illustrating operation S200 to prepare a light emitting module 202 as a test object with the light source.

Referring to FIG. 15, operation S200 may include an operation to dispose the light source 212 completed in the previous operation S100 on the substrate 232. Here, a plurality of light sources 212 may be disposed on the substrate 232.

Next, the light sources 212 disposed on the substrate 232 may be electrically connected to a driving unit 222 providing driving power thereto. The driving unit 222 may include a rectifier, a DC/DC converter, or the like, providing a constant current to the light sources 212. Also, the driving unit 222 may include an integrated chip (IC) circuit for providing a predetermined appropriate current value to the light sources 212.

Figure 16:
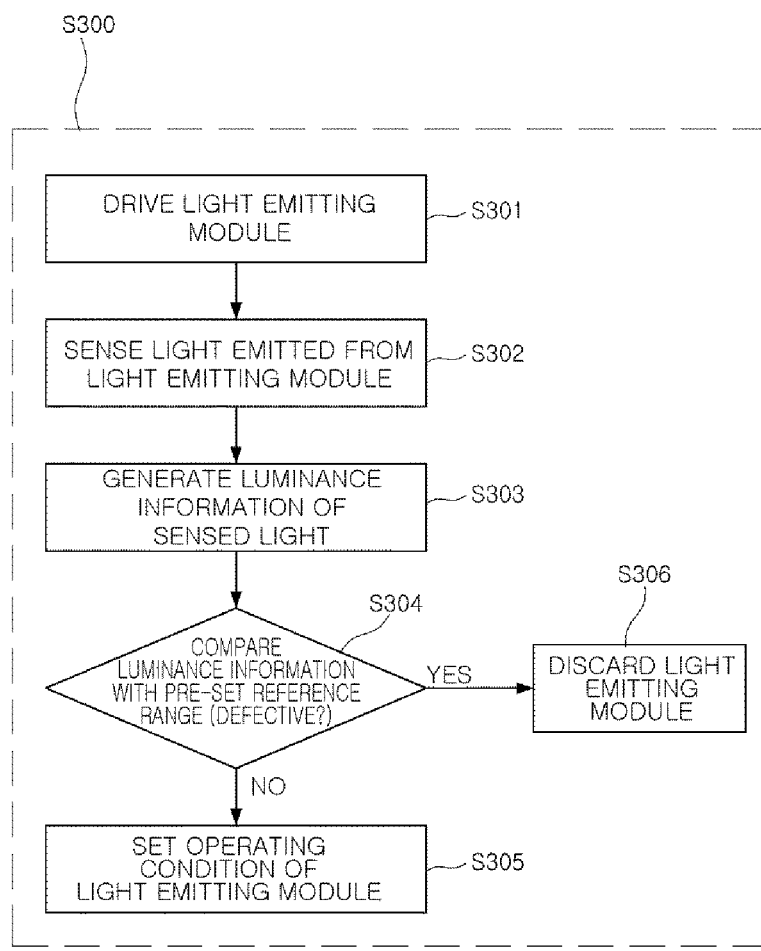
FIG. 16 is a flow chart illustrating an operation to test a light emitting module.

FIG. 16 is a flow chart illustrating operation S300 to test a light emitting module.

Referring to FIG. 16, operation S300 to test a light emitting module may include operation S301 to drive the light emitting module as a test object, operation S302 to sense light emitted from the light emitting module while it is being driven, operation S303 to generate luminance information of the sensed light, operation S304 to compare the luminance information with a pre-set reference range and determine whether the light emitting module is defective, and operation S305 to set an operating condition of the light emitting module as a test object or operation S306 to discard the light emitting module as a test object. Operation S300 may be performed by using the light emitting module testing apparatus 100 as described above.

In this case, operation S302 to sense light emitted from the light emitting module may be performed by the sensing unit 110, and operations S303 to generate luminance of the sensed light, S304 to compare the luminance information with the pre-set reference range, and S305 to set an operating condition of the light emitting module as a test object may be performed by the controller 120. By comparing the luminance information with the pre-set reference range (S304), the controller 120 may determine whether the light emitting module is defective.

Figure 17A:
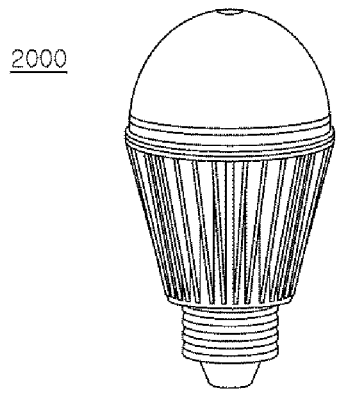
FIGS. 17A through 17C illustratively show lighting devices that have undergone testing.
Figure 17B:
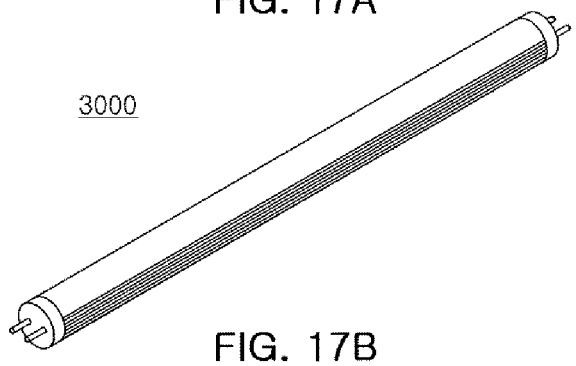
Figure 17C:
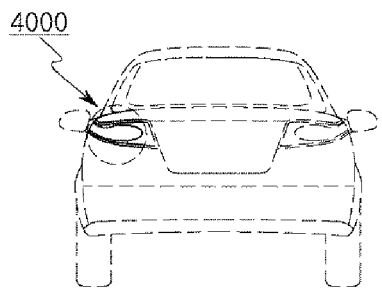

FIGS. 17A through 17C illustratively show lighting devices that have undergone testing. In detail, the lighting device may be a bulb-type lighting device 2000 or an L-tube type lighting device 3000, respectively, as illustrated in FIGS. 17A and 17B. Here, a "lighting device" is not particularly limited in its purpose for illumination. Additionally, the lighting device may be understood as a concept including a vehicle headlight 4000 as shown in FIG. 17C.

According to the present exemplary embodiment, the lighting device having a light emitting module whose operating condition is set to have an appropriate luminance may be efficiently manufactured.

As set forth above, according to exemplary embodiments of the present disclosure, a light emitting module testing apparatus is capable of sensing luminance of light emitted from a light emitting module serving as a test object, and setting an operating condition of the light emitting module to have an appropriate luminance.

Advantages and effects of the present disclosure are not limited to the foregoing content and any other technical effects not mentioned herein may be easily understood by a person skilled in the art from the foregoing description.

While exemplary embodiments have been shown and described above, it will be apparent to those skilled in the art that modifications and variations could be made without departing from the spirit and scope of the present disclosure as defined by the appended claims.

What is claimed is:

1. A light emitting module testing apparatus, comprising:
a sensing unit including a photodiode array sensing light emitted from a light emitting module serving as a test object before being included in a lighting device; and
a controller generating luminance information based on light sensed by the sensing unit, and setting an operating condition of the light emitting module serving as the test object by comparing the generated luminance information with a reference luminance profile identifying, at each of a plurality of respective locations, a respective pre-set reference range of luminance for the respective location.

2. The light emitting module testing apparatus of claim 1, wherein the operating condition of the light emitting module set by the controller is a current value applied by a driving unit provided in the light emitting module to a light source provided in the light emitting module.

3. The light emitting module testing apparatus of claim 2, wherein the photodiode array comprises first to $n^{th}$ photodiodes where n is a natural number greater than or equal to 2.

4. The light emitting module testing apparatus of claim 3, wherein the luminance information generated by the controller is a luminance profile including information regarding luminance of light sensed at locations of each of the first to $n^{th}$ photodiodes.

5. The light emitting module testing apparatus of claim 4, wherein the reference luminance profile comprises a maximum reference luminance profile identifying an upper limit of the luminance for each of the plurality of respective locations and a minimum reference luminance profile identifying a lower limit of the luminance for each of the plurality of respective locations.

6. The light emitting module testing apparatus of claim 5, wherein when the luminance profile generated by the controller has a region exceeding the maximum reference luminance profile, the controller sets the operating condition of the light emitting module so as to decrease the current value applied by the driving unit provided in the light emitting module to the light source provided in the light emitting module.

7. The light emitting module testing apparatus of claim 5, wherein when the luminance profile generated by the controller has a region lower than the minimum reference luminance profile, the controller sets the operating condition of the light emitting module so as to increase the current value applied by the driving unit provided in the light emitting module to the light source provided in the light emitting module.

8. The light emitting module testing apparatus of claim 5, wherein when a difference between a maximum value of the luminance profile generated by the controller and a minimum value of the luminance profile generated by the controller for a respective location is greater than a difference between the maximum reference luminance profile and the minimum reference luminance profile for the respective location, the controller determines that the light emitting module is defective.

9. The light emitting module testing apparatus of claim 5, wherein at least one of the maximum reference luminance profile and the minimum reference luminance profile has a linear shape.

10. The light emitting module testing apparatus of claim 5, wherein at least one of the maximum reference luminance profile and the minimum reference luminance profile has a curved shape.

11. The light emitting module testing apparatus of claim 5, wherein the sensing unit comprises first to $m^{th}$ photodiode arrays each including first to $n^{th}$ photodiodes, where m is a natural number greater than or equal to 2, and
the luminance information generated by the controller is a single average luminance profile derived by averaging first to $m^{th}$ luminance profiles respectively obtained by the first to $m^{th}$ photodiode arrays.

12. The light emitting module testing apparatus of claim 1, wherein the sensing unit is disposed to be positioned directly above a main light emitting surface of the light emitting module.

13. The light emitting module testing apparatus of claim 1, wherein the photodiode array comprises first to $n^{th}$ photodiodes where n is a natural number greater than or equal to 2, and
the sensing unit comprises a bar-like light receiving part in which the photodiode array is disposed.

14. The light emitting module testing apparatus of claim 1, wherein the sensing unit comprises first to $m^{h}$ photodiode arrays each including first to $n^{th}$ photodiodes and first to $m^{th}$ bar-like light receiving parts in which the first to $m^{th}$ photodiode arrays are respectively disposed, where n and m are natural numbers greater than or equal to 2.

15. A light emitting module testing apparatus, comprising:
a sensing unit including a photodiode array sensing light emitted from a light emitting module serving as a test object before being included in a lighting device, the light emitting module having a light source and having a driving unit providing a pre-selected current to drive the light source; and
a controller generating luminance information based on light sensed by the sensing unit, and comparing the luminance information with a reference luminance profile identifying, at each of a plurality of respective locations, a respective pre-set reference range of luminance for the respective location to set the pre-selected current value applied by the driving unit provided in the light emitting module to the light source such that the luminance information of light emitted from the light emitting module serving as the test object satisfies the reference luminance profile.

16. A light emitting module testing apparatus, comprising:
a sensing unit including a plurality of photodiodes disposed on a substrate for sensing, at locations of each of the plurality of photodiodes, light emitted from a light emitting module serving as a test object before being included in a lighting device; and
a controller coupled to the sensing unit, generating a luminance profile including, for each respective location of a plurality of locations of the photodiodes, luminance information of light sensed at the respective location, and generating a control signal based on comparing the luminance information of light sensed at each respective location with a reference luminance profile identifying, at each of a plurality of respective locations, a respective pre-set luminance range for the respective location.

17. The light emitting module testing apparatus of claim 16, wherein each photodiode of the plurality of photodiodes is connected to a respective transistor, and the controller receives an electrical signal from each respective transistor connected to a photodiode of the plurality of photodiodes indicative of luminance of light sensed at the location of the respective photodiode.

18. The light emitting module testing apparatus of claim 16, wherein the controller generates the luminance profile by averaging, for each of a plurality of locations of photodiodes, luminance information of light sensed by photodiodes at or proximate to the respective location, and generates the control signal based on comparing the averaged luminance information of light sensed at each location with the reference luminance profile identifying the respective pre-set luminance range for the respective location.

19. The light emitting module testing apparatus of claim 18, wherein the reference luminance profile identifying the respective pre-set luminance range for each respective location of the plurality of respective locations includes different luminance ranges for different ones of the locations of the photodiodes.

20. The light emitting module testing apparatus of claim 16, wherein the sensing unit is disposed to be positioned directly above a main light emitting surface of the light emitting module.

* * * * *